United States Patent
Fu

(10) Patent No.: US 6,930,534 B1
(45) Date of Patent: Aug. 16, 2005

(54) TEMPERATURE COMPENSATED INTEGRATED CIRCUITS

(75) Inventor: Robert Fu, Cupertino, CA (US)

(73) Assignee: Transmeta Corporation, Santa Clara, CA (US)

( * ) Notice: Subject to any disclaimer, the term of this patent is extended or adjusted under 35 U.S.C. 154(b) by 0 days.

(21) Appl. No.: 10/439,659

(22) Filed: May 16, 2003

(51) Int. Cl.$^7$ .......................................... H03K 17/687
(52) U.S. Cl. .................... 327/427; 327/512; 327/112; 326/108; 331/57
(58) Field of Search ................................ 327/512–513, 327/108, 112, 427, 170; 326/104, 106, 108; 331/57

(56) References Cited

U.S. PATENT DOCUMENTS

| | | | | |
|---|---|---|---|---|
| 3,991,380 A | * | 11/1976 | Pryor | 330/253 |
| 6,028,490 A | * | 2/2000 | Komatsu | 331/57 |
| 6,690,242 B2 | * | 2/2004 | Fang et al. | 331/57 |

* cited by examiner

*Primary Examiner*—Quan Tra
(74) *Attorney, Agent, or Firm*—Wagner, Murabito & Hao LLP

(57) ABSTRACT

A method and system of temperature compensated integrated circuits. Operating characteristics of integrated circuitry are enhanced by application of temperature compensation.

13 Claims, 6 Drawing Sheets

600

```
GENERATE AN OUTPUT SIGNAL FROM A FIRST CIRCUITRY.
THE FIRST CIRCUITRY COMPRISES A FIRST TRANSISTOR
DEVICE HAVING A FIRST FREQUENCY-OPERATING
TEMPERATURE CHARACTERISTIC.
610
```

↓

```
GENERATE AN OUTPUT SIGNAL FROM A SECOND
CIRCUITRY. THE SECOND CIRCUITRY COMPRISES A
SECOND TRANSISTOR DEVICE CONFIGURED AS A DIODE
HAVING A SECOND FREQUENCY-OPERATING
TEMPERATURE CHARACTERISTIC.
620
```

↓

```
THE SECOND FREQUENCY-OPERATING CHARACTERISTIC
DAMPENS THE FIRST FREQUENCY-OPERATING
TEMPERATURE CHARACTERISTIC.
630
```

↓

( FINISH )

FIGURE 6

TEMPERATURE COMPENSATED INTEGRATED CIRCUITS

FIELD OF THE INVENTION

Embodiments in accordance with the present invention relate to the design and operation of integrated circuits.

BACKGROUND

The characteristics of integrated circuits, e.g., operating frequency, gate delay and the like, vary widely with changes in operating temperature.

SUMMARY OF THE INVENTION

A method and system of temperature compensated integrated circuits are disclosed.

BRIEF DESCRIPTION OF THE DRAWINGS

FIG. 6 illustrates a flow diagram of a method of operating an integrated circuit, in accordance with embodiments of the present invention.

DETAILED DESCRIPTION OF THE INVENTION

In the following detailed description of the present invention, temperature compensated integrated circuits, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

TEMPERATURE COMPENSATED INTEGRATED CIRCUITS

Embodiments of the present invention are described in the context of design and operation of integrated semiconductors. More particularly, embodiments of the present invention relate to temperature compensated integrated circuits. It is appreciated, however, that elements of the present invention may be utilized in other areas of semiconductor operation.

Although the following description of embodiments in accordance with the present invention describes semiconductors formed in p-type materials, it is to be appreciated that symmetries with n-type materials are well known. For example, in general, exchanging p-type materials and processes with n-type materials and processes, can create symmetric structures and behaviors. Consequently, embodiments in accordance with the present invention are well suited to semiconductors formed in n-type materials, and such embodiments are within the scope of the present invention.

Variations in the operation of integrated circuits corresponding to changes in temperature are well known. For example, the same integrated circuit generally operates faster, e.g., has a higher maximum operating frequency, at a lower temperature than it does at a higher temperature.

It is often desirable to minimize such variations in operation of integrated circuits with respect to variations in temperature. For example, a design may desire for gate delay characteristics to remain relatively constant over a range of temperatures. As another example, it may be advantageous to operate an integrated circuit at extreme temperatures, e.g., temperatures beyond a typical commercial temperature range, for example, as required by the automotive market.

Figures 1A, 1B:
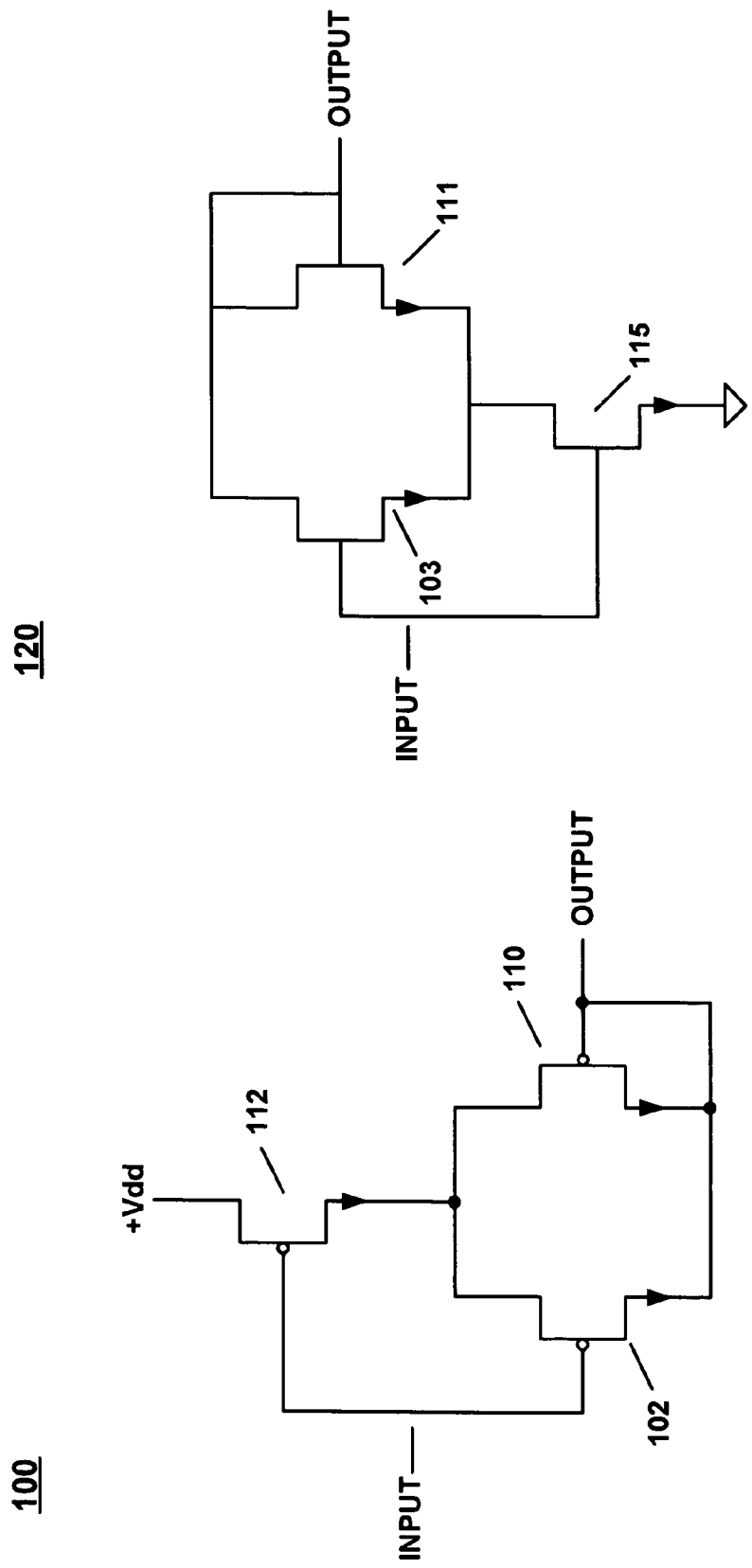
FIG. 1A illustrates a temperature compensated transfer resistor circuit, in accordance with embodiments of the present invention.
FIG. 1B illustrates a temperature compensated transfer resistor circuit, in accordance with embodiments of the present invention.

FIG. 1A illustrates a temperature compensated transfer resistor circuit 100, in accordance with embodiments of the present invention. Temperature compensated transfer resistor circuit 100 comprises p-type transistor device 102 and p-type transistor device 110. It is to be appreciated that transistor device 110 is configured as a diode. The sources of transistor devices 102 and 110 are coupled to a higher voltage. Such higher voltage is frequently a power rail. However, it is to be appreciated that transfer resistor circuit 100 may be used in conjunction with other circuit elements and that sometimes a higher voltage comprises a terminal of another circuit. Similarly, the drains of transistor devices 102 and 110 are coupled to a lower voltage. Such lower voltage is typically an output terminal. However, it is to be appreciated that transfer resistor circuit 100 may be used in conjunction with other circuit elements and that sometimes a lower voltage comprises a terminal of another circuit.

As operating temperature of temperature compensated transfer resistor circuit 100 decreases, thermal lattice scattering decreases, and carrier mobility increases. Consequently, transistor device 102 becomes "stronger," for example, demonstrating an increase in maximum frequency of operation and a decrease in switching time. In addition, the threshold voltages of devices 102 and 110 increase with decreasing temperature. An increase in threshold voltage generally decreases current drive capabilities of such devices. A decrease in current drive tends to "weaken" a transistor, for example, decreasing frequency of operation. In general, the "strengthening" due to increased carrier mobility dominates any "weakening" due to threshold voltage increases for a transistor configured in the manner of device 102. For a transistor configured in the manner of transistor device (diode) 110, the "weakening" due to an increasing threshold voltage dominates the "strengthening" due to increased carrier mobility.

In temperature compensated transfer resistor circuit 100, diode 110 is coupled to transistor device 102 so as to oppose the increase in operating frequency of transistor device 102 with decreasing temperature. As diode 110 becomes weaker with decreasing temperature, it counteracts the effects of transistor device 102 becoming stronger. As temperature increases, diode 110 becomes stronger, having less of a counteraction to transistor device 102. As a beneficial consequence, temperature compensated transfer resistor circuit 100 exhibits less dependence of operating characteristics on temperature than does transistor device 102 alone.

It is to be appreciated that transistor device 102 and diode 110 create a parallel current path. The amount of total current through the combination of devices 102 and 110 is stable over temperature because device 102 has a frequency versus temperature characteristic of opposite sign to that of device 110. More specifically, device 102 becomes faster with decreasing temperature and device 110 becomes slower with decreasing temperature.

The size and shape of transistor devices 102 and 110 to achieve a desired frequency response to temperature characteristic can be determined through a process of simulation. Size and shape of transistor devices in integrated circuits are generally given as a ratio, e.g., "10/8." The first number specifies the width of the cell, e.g., "10," and the second number specifies the length of the cell, e.g., "8." It is appreciated that the terms "length" and "width" have specific meanings within the semiconductor arts, and that in general the dimensions are not interchangeable. The numbers typically indicate the dimension in microns. For an exemplary temperature compensated transfer resistor circuit 100 constructed in a 0.13 micron process, transistor device 102 can comprise a 10/8 p-type transistor device. Diode device 110 can be a 20/1.4 p-type transistor device.

Still referring to FIG. 1A, devices 102 and 110 form a basis for a temperature compensated circuit element. The addition of pull up (p-type) transistor device 112 forms a generally more functional circuit, and completes transfer resistor circuit 100. Exemplary dimensions for pull up transistor device 112 are 10/1.6.

FIG. 1B illustrates a temperature compensated transfer resistor circuit 120, in accordance with embodiments of the present invention. Temperature compensated transfer resistor circuit 100 comprises n-type transistor device 103 and n-type transistor device 111. It is to be appreciated that transistor device 111 is configured as a diode. The sources of transistor devices 103 and 111 are coupled to a higher voltage. Such higher voltage is frequently an output terminal. However, it is to be appreciated that transfer resistor circuit 100 may be used in conjunction with other circuit elements and that sometimes a higher voltage comprises a terminal of another circuit. Similarly, the drains of transistor devices 102 and 110 are coupled to a lower voltage. Such lower voltage is typically a ground rail. However, as above, it is to be appreciated that transfer resistor circuit 100 may be used in conjunction with other circuit elements and that sometimes a lower voltage comprises a terminal of another circuit.

As operating temperature of temperature compensated transfer resistor circuit 120 decreases, thermal lattice scattering decreases, and carrier mobility increases. Consequently, transistor device 103 becomes "stronger," for example, demonstrating an increase in maximum frequency of operation and a decrease in switching time. In addition, the threshold voltages of devices 103 and 111 increase with decreasing temperature. An increase in threshold voltage generally decreases current drive capabilities of such devices. A decrease in current drive tends to "weaken" a transistor, for example, decreasing frequency of operation. In general, the "strengthening" due to increased carrier mobility dominates any "weakening" due to threshold voltage increases for a transistor configured in the manner of device 103. For a transistor configured in the manner of transistor device (diode) 111, the "weakening" due to an increasing threshold voltage dominates the "strengthening" due to increased carrier mobility.

In temperature compensated transfer resistor circuit 120, diode 111 is coupled to transistor device 103 so as to oppose the increase in operating frequency of transistor device 103 with decreasing temperature. As diode 111 becomes weaker with decreasing temperature, it counteracts the effects of transistor device 103 becoming stronger. As temperature increases, diode 111 becomes stronger, having less of a counteraction to transistor device 103. As a beneficial consequence, temperature compensated transfer resistor circuit 100 exhibits less dependence of operating characteristics on temperature than does transistor device 103 alone.

It is to be appreciated that transistor device 103 and diode 111 create a parallel current path. The amount of total current through the combination of devices 103 and 111 is stable over temperature because device 103 has a frequency versus temperature characteristic of opposite sign to that of device 111. More specifically, device 103 becomes faster with decreasing temperature and device 111 becomes slower with decreasing temperature.

The size and shape of transistor devices 103 and 111 to achieve a desired frequency response to temperature characteristic can be determined through a process of simulation. For an exemplary temperature compensated transfer resistor circuit 120 constructed in a 0.13 micron process, transistor device 103 can comprise a 5/10 p-type transistor device. Diode device 111 can be a 10/1.4 p-type transistor device.

Still referring to FIG. 1B, devices 103 and 111 form a basis for a temperature compensated circuit element. The addition of pull down (n-type) transistor device 115 forms a generally more functional circuit, and completes transfer resistor circuit 100. Exemplary dimensions for pull down transistor device 115 are 5/1.6.

In accordance with embodiments of the present invention, temperature compensated transfer resistor circuit 100 can generally be substituted for conventional p-type transistor devices in a circuit design, and temperature compensated transfer resistor circuit 120 can generally be substituted for conventional n-type transistor devices in a circuit design. Such substitutions will generally cause operating characteristics, e.g., maximum operating frequency or switching time, to exhibit less variation with changes in temperature in comparison with the original circuit design. It is appreciated that adjustments to size and/or shape of components of transfer resistor circuits 100 and 120 can be made so as to better match characteristics, e.g., drive capability, of transistors in a design when substituted for such transistors.

Figure 2:
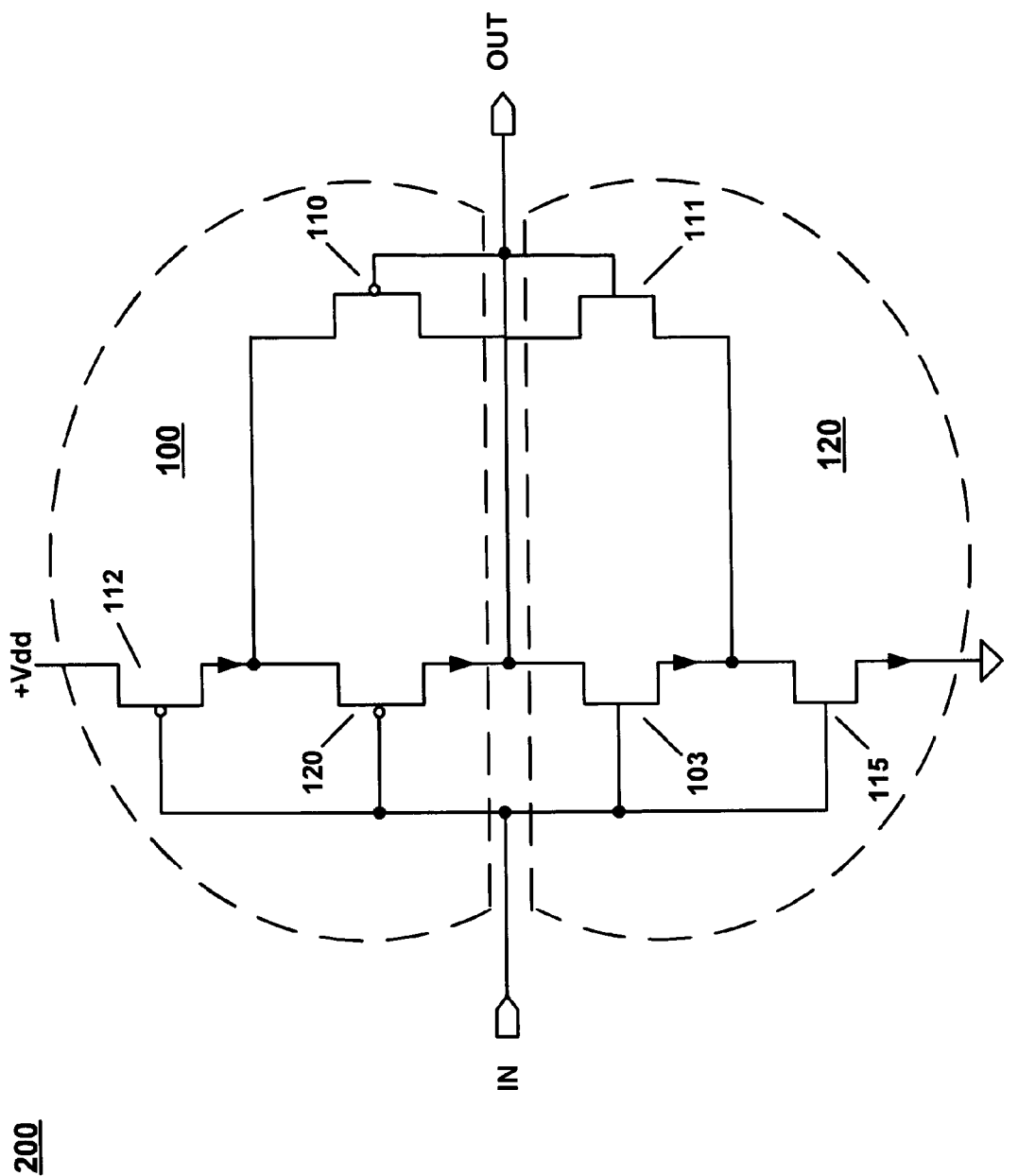
FIG. 2 illustrates a temperature compensated inverter circuit, in accordance with embodiments of the present invention.

FIG. 2 illustrates a temperature compensated inverter circuit 200, in accordance with embodiments of the present invention. It is to be appreciated that temperature compensated inverter circuit 200 comprises temperature compensated transfer resistor circuit 100 coupled to temperature compensated transfer resistor circuit 120.

In accordance with embodiments of the present invention, temperature compensated inverter circuit 200 exhibits less frequency dependence upon temperature than conventional inverter designs. As a beneficial consequence, temperature compensated inverter circuit 200 can be utilized in circuits intended for operation across a wide range of temperatures and/or at extreme temperatures.

Figure 3:
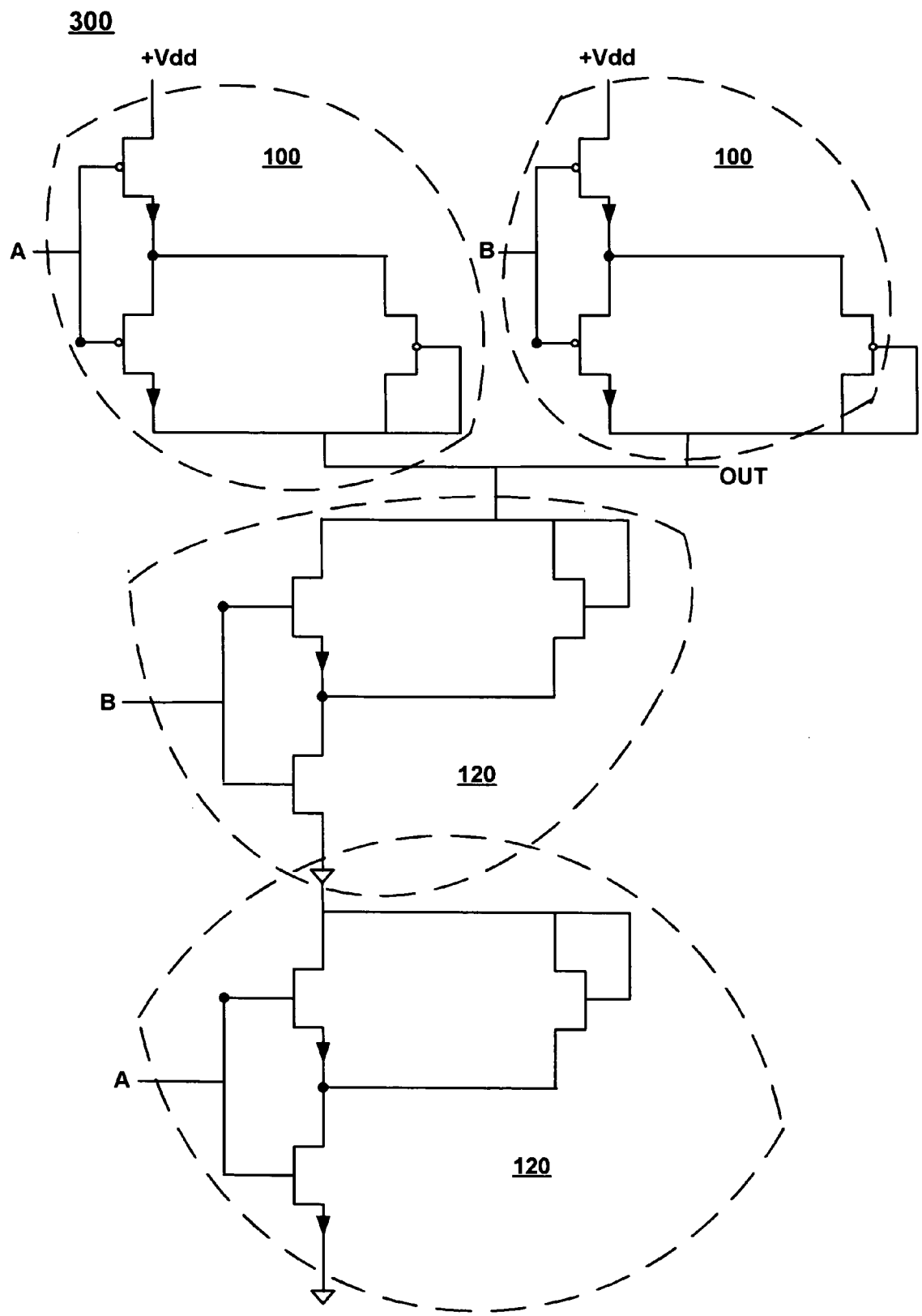
FIG. 3 illustrates a temperature compensated NAND circuit, in accordance with embodiments of the present invention.

FIG. 3 illustrates a temperature compensated NAND circuit 300, in accordance with embodiments of the present invention. It is to be appreciated that temperature compensated NAND circuit 300 comprises two instances of temperature compensated transfer resistor circuit 100 coupled to two instances of temperature compensated transfer resistor circuit 120.

In accordance with embodiments of the present invention, temperature compensated NAND circuit 300 exhibits less frequency dependence upon temperature than conventional NAND gate designs. As a beneficial consequence, temperature compensated NAND circuit 300 can be utilized in circuits intended for operation across a wide range of operating temperatures and/or at extreme operating temperatures.

Figure 4:
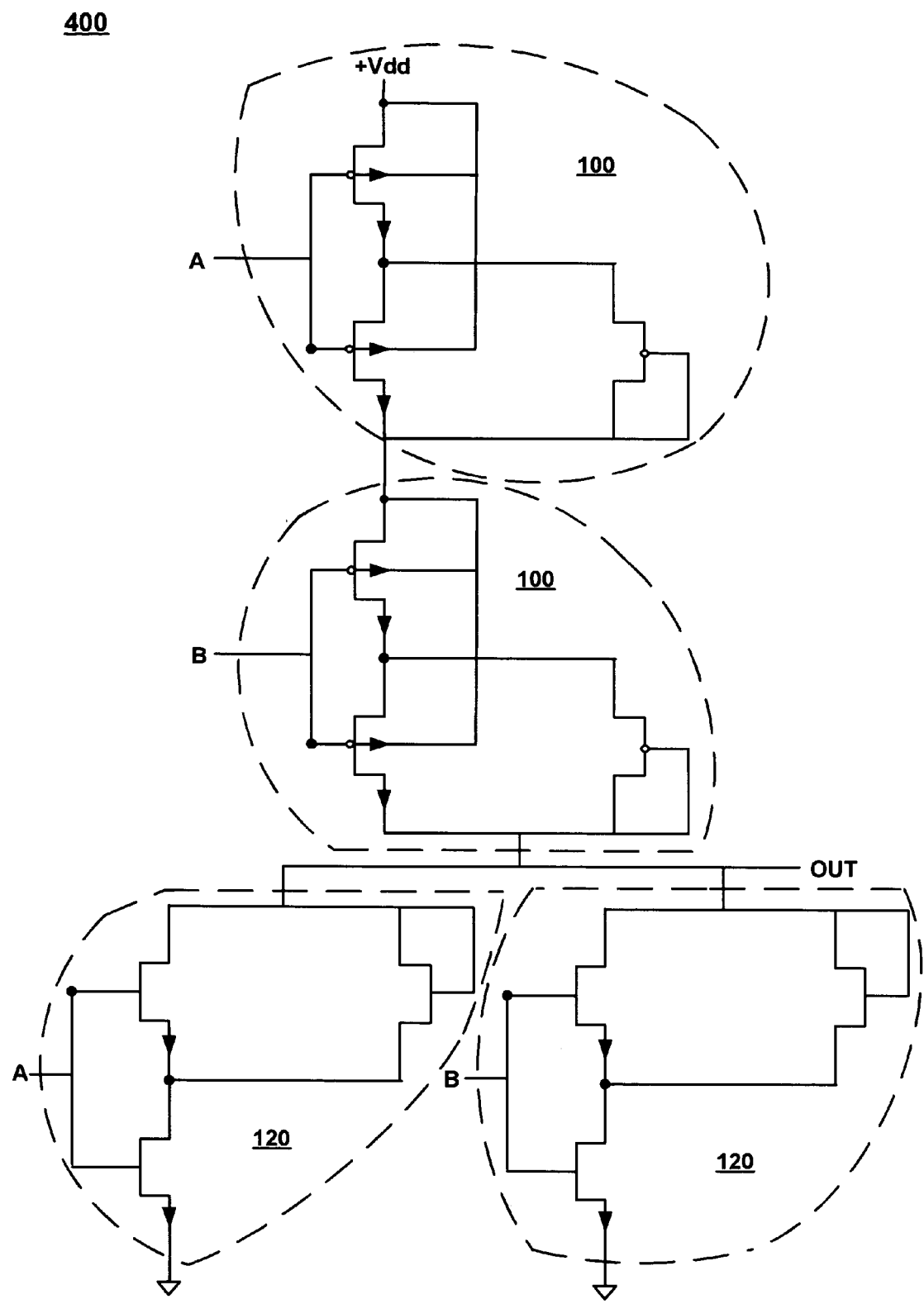
FIG. 4 illustrates a temperature compensated NOR circuit, in accordance with embodiments of the present invention.

FIG. 4 illustrates a temperature compensated NOR circuit 400, in accordance with embodiments of the present invention. It is to be appreciated that temperature compensated NOR circuit 400 comprises two instances of temperature compensated transfer resistor circuit 100 coupled to two instances of temperature compensated transfer resistor circuit 120.

In accordance with embodiments of the present invention, temperature compensated NOR circuit 400 exhibits less frequency dependence upon temperature than conventional NOR gate designs. As a beneficial consequence, temperature compensated NOR circuit 400 can be utilized in circuits intended for operation across a wide range of operating temperatures and/or at extreme operating temperatures.

A ring oscillator circuit generally comprises an odd number of inverter stages coupled in a ring configuration. It is to be appreciated that rings comprising other inverting circuits, e.g., a NAND gate, are well suited to embodiments in accordance with the present invention. A ring oscillator will oscillate, or "ring," at a frequency determined, in part, by switching delay times of the inverter stages and the number of inverter stages. Ring oscillators are a straightforward source of oscillating clock signals in integrated circuits, and are an ideal frequency source for many applications. Since a ring oscillator does not require external components, e.g., a crystal, ceramic resonator or external resistors and/or external capacitors, ring oscillators can be implemented at lower cost and in a smaller size than many other clock sources.

However, ring oscillators are sometimes not used in integrated circuit designs because their frequency of operation is determined (in part) by the switching delay time of each inverter stage. As has been discussed previously, switching delay time of a conventional inverter stage varies with operating temperature. Consequently, the frequency of a conventional ring oscillator varies with operating temperature. Because a conventional ring oscillator frequently has many stages, the variation of switching delay time due to operating temperature variations for a single stage is magnified by the number of stages, producing great frequency variations in response to operating temperature changes for the entire oscillator.

Figure 5:
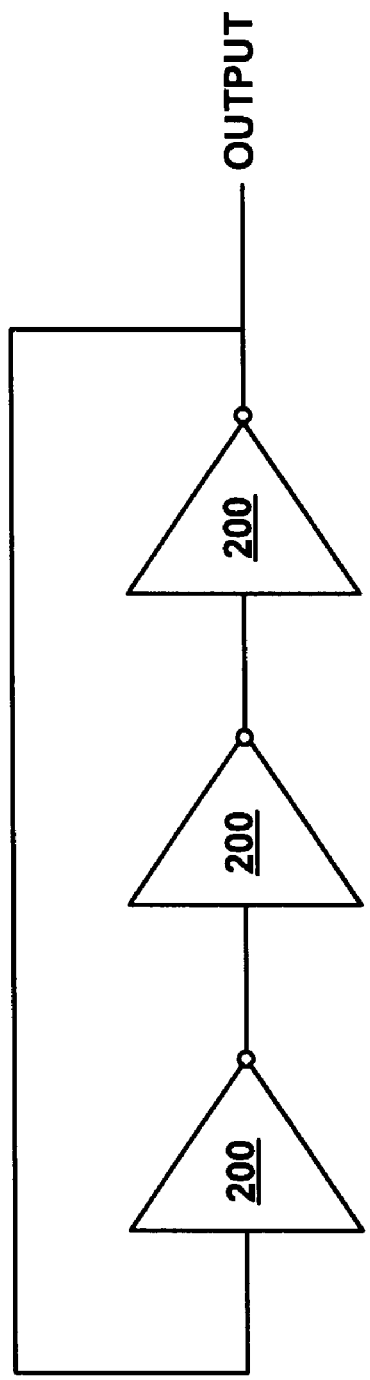
FIG. 5 illustrates a temperature compensated ring oscillator circuit, in accordance with embodiments of the present invention.

FIG. 5 illustrates a temperature compensated ring oscillator circuit 500, in accordance with embodiments of the present invention. Temperature compensated ring oscillator circuit 500 comprises three stages. Each stage is comprised of a temperature compensated inverter circuit 200 as described above. Ring oscillators comprising other voltage compensated circuits, e.g., temperature compensated NAND circuit 300 or temperature compensated NOR circuit 400, comprising homogeneous or heterogeneous stages, and/or circuits comprising more stages of feedback, are well suited to embodiments in accordance with the present invention. The frequency of operation of a ring oscillator, e.g., temperature compensated ring oscillator circuit 500, depends, in part, on the delay inherent to each inverter stage and the number of stages provided in the ring.

Because the stages comprising temperature compensated ring oscillator circuit 500 have a stable frequency response over a range of operating temperatures, temperature compensated ring oscillator circuit 500 exhibits a similar desirable stable frequency response over a range of operating temperatures. Temperature compensated ring oscillator circuit 500 can be advantageously utilized to provide a stable frequency, e.g., for use as a microprocessor clock or to control a charge pump circuit, while operating an integrated circuit across a wide range of temperatures, e.g., for the automotive market. Further, temperature compensated ring oscillator circuit 500 can beneficially provide a stable frequency while operating at extreme temperatures, e.g., in a small computer system with limited cooling capacity.

FIG. 6 illustrates a flow diagram of a method 600 of operating an integrated circuit, in accordance with embodiments of the present invention. In block 610, an output signal from a first circuitry is generated.

The first circuitry comprises a first transistor device having a first frequency-operating temperature characteristic.

In block 620, an output signal from a second circuitry is generated. The second circuitry comprises a second transistor device configured as a diode having a second frequency-operating temperature characteristic. The second circuitry is coupled in parallel to the first circuitry. More specifically, the outputs of the first and second circuitry are coupled.

In block 630, the second frequency-operating temperature characteristic dampens the first frequency-operating temperature characteristic. In this novel manner, the second circuit enhances the stability of characteristics, e.g., maximum frequency, switching and delay times, with respect to supply voltage of the combination of the two circuits in comparison to the characteristics of the first circuitry alone.

Embodiments in accordance with the present invention, temperature compensated integrated circuits, are thus described. While the present invention has been described in particular embodiments, it should be appreciated that the present invention should not be construed as limited by such embodiments, but rather construed according to the below claims.

What is claimed is:

1. A ring oscillator integrated circuit comprising:
   an odd number of inverter stages coupled in a ring configuration, each of said inverter stages comprising:
   first, second, third, fourth, fifth and sixth transistor devices;
   wherein said first, second, fourth and fifth transistor devices are coupled in series via their source and drain terminals;
   wherein gate terminals of said first, second, fourth and fifth transistor devices are coupled together;
   wherein said third and sixth transistor devices are coupled in series between said source of said second transistor device and said drain of said fourth transistor device;
   wherein gate terminals of said third and sixth transistor devices are coupled together;
   wherein said gate and drain terminals of said third transistor device are coupled to said drain terminal of said second transistor device; and
   wherein a common coupling of gate terminals of said first, second, fourth and fifth transistor devices form an input terminal for said inverter stage.

2. A temperature compensated NAND integrated circuit comprising:
- first, second, third and fourth temperature compensated transfer resistor circuits, each of said temperature compensated transfer resistor circuits comprising:
- first and second transistor devices coupled in series drain to source;
- a third transistor device coupled in parallel with said second transistor device;
- wherein gate terminals of said first and second transistor devices are coupled together;
- wherein gate and drain terminals of said third transistor device are coupled together;
- wherein said first and second temperature compensated transfer resistor circuits taking separate inputs are coupled together in parallel;
- wherein said third and fourth temperature compensated transfer resistor circuits taking separate inputs are coupled together in series; and
- wherein outputs of said first, second and third temperature compensated transfer resistor circuits are coupled together.

3. The temperature compensated NAND integrated circuit of claim 2 wherein a frequency response characteristic of said temperature compensated NAND integrated circuit shows substantially less variation with temperature than a frequency response characteristic of a similar temperature compensated NAND integrated circuit absent said third transistor devices.

4. The temperature compensated NAND integrated circuit of claim 2 wherein said first and second temperature compensated transfer resistor circuits comprise p-type carriers.

5. The temperature compensated NAND integrated circuit of claim 2 wherein said third and fourth temperature compensated transfer resistor circuits comprise n-type carriers.

6. The temperature compensated NAND integrated circuit of claim 2 embodied in a microprocessor.

7. The temperature compensated NAND integrated circuit of claim 6 embodied in a computer system.

8. A temperature compensated NOR integrated circuit comprising:
- first, second, third and fourth temperature compensated transfer resistor circuits, each of said temperature compensated transfer resistor circuits comprising:
- first and second transistor devices coupled in series drain to source;
- a third transistor device coupled in parallel with said second transistor device;
- wherein gate terminals of said first and second transistor devices are coupled together;
- wherein gate and drain terminals of said third transistor device are coupled together;
- wherein said first and second temperature compensated transfer resistor circuits taking separate inputs are coupled together in parallel;
- wherein said third and fourth temperature compensated transfer resistor circuits taking separate inputs are coupled together in series; and
- wherein outputs of said first, second and third temperature compensated transfer resistor circuits are coupled together.

9. The temperature compensated NOR integrated circuit of claim 8 wherein a frequency response characteristic of said temperature compensated NOR integrated circuit shows substantially less variation with temperature than a frequency response characteristic of a similar temperature compensated NOR integrated circuit absent said third transistor devices.

10. The temperature compensated NOR integrated circuit of claim 8 wherein said third and fourth temperature compensated transfer resistor circuits comprise p-type carriers.

11. The temperature compensated NOR integrated circuit of claim 8 wherein said first and second temperature compensated transfer resistor circuits comprise n-type carriers.

12. The temperature compensated NOR integrated circuit of claim 8 embodied in a microprocessor.

13. The temperature compensated NOR integrated circuit of claim 12 embodied in a computer system.

* * * * *